United States Patent [19]
Winnerl et al.

[11] Patent Number: 6,136,717
[45] Date of Patent: Oct. 24, 2000

[54] METHOD FOR PRODUCING A VIA HOLE TO A DOPED REGION

[75] Inventors: Josef Winnerl; Walter Neumueller, both of Munich, Germany

[73] Assignee: Siemens Aktiengesellschaft, Munich, Germany

[21] Appl. No.: 08/052,910

[22] Filed: Apr. 27, 1993

[30] Foreign Application Priority Data

Apr. 29, 1992 [DE] Germany .............................. 42 14 123

[51] Int. Cl.⁷ .............................................. H01L 21/302
[52] U.S. Cl. ......................... 438/705; 438/279; 438/659; 438/669; 438/924
[58] Field of Search .............................. 437/56, 195, 162, 437/29, 46, 57, 58; 156/628; 438/279, 659, 669, 482, 705, 924

[56] References Cited

U.S. PATENT DOCUMENTS

| | | | |
|---|---|---|---|
| 4,090,915 | 5/1978 | Keller | 148/187 |
| 4,231,820 | 11/1980 | Henry | 148/187 |
| 4,438,556 | 3/1984 | Komatsu et al. | 156/628 |
| 4,549,914 | 10/1985 | Oh | 437/162 |
| 4,569,123 | 2/1986 | Ishii et al. | 437/162 |
| 4,601,778 | 7/1986 | Robb | 156/628 |
| 4,629,520 | 12/1986 | Ueno et al. | 437/29 |
| 4,729,969 | 3/1988 | Suda et al. | 437/200 |
| 4,748,492 | 5/1988 | Iwase et al. | 257/390 |
| 4,868,138 | 9/1989 | Chan et al. | 437/195 |
| 4,992,389 | 2/1991 | Ogura et al. | 437/56 |
| 5,019,527 | 5/1991 | Ohshima et al. | 437/44 |
| 5,081,065 | 1/1992 | Jonkers et al. | 437/200 |

FOREIGN PATENT DOCUMENTS 2 143 126  2/1973  France .

OTHER PUBLICATIONS

Patent Abstracts of Japan, vol. 8, No. 41 (C–211) Feb. 22, 1984 and JP–a–58 199 869 (Matsushita Denki Denki Sangyo K.K.) Nov. 21, 1983.

"SDX: A Novel Self–Aligned Technique and Its Application to High–Speed Bipolar LSI's," Y. Yamamoto, et al., IEEE Transactions on Electron Devices Bd. 35, Nr. 10, Oct., 1987.

"A Self–Aligning Polysilicon Electrode Technology (SPEL) For Future LSTS," Y. Misawa, et al., International Electron Devices Meeting Dec. 6, 1987, Washington, D.C., pp. 32–35.

K. H. Kuesters, et al., "A High Density 4 bit dRAM Process Using a Fully Overlapping Bitline Contact (FoBiC) Trench Cell", Sympos. on VLSI Technology, 1987 Tech. Digest, pp. 93–94 ff.

K. H. Kuesters, et al., "A Self Aligned Contact Process With Improved Surface Planarization", ESSDERC 1988, Journal de Physique, pp. 503–506 ff.

K. Sasaki, "Silicided Source/Drain Process for MOSFET", IBM Technical Disclosure Bulletin, vol. 34, No. 3, Aug., 1991, pp. 42–43.

Bob Reuss, et al., "High Selectivity Contact Etch for BiCMOS and CMOS", Motorola, Inc., Technical Developments, vol. 14, Dec. 1991, pp. 97–98.

*Primary Examiner*—Michael Trinh
*Attorney, Agent, or Firm*—Hill & Simpson

[57] ABSTRACT

A method for producing a via hole to a doped region in a semiconductor device, including the steps of: producing the doped region in a substrate such that the doped region is limited by insulating regions at least at a surface of the substrate; depositing an undoped silicon layer surface-wide on the substrate; producing a doped region in the silicon layer that overlaps a region for the via hole; selectively removing the undoped silicon of the silicon layer relative to the doped region of the silicon layer; producing an insulating layer surface-wide; and forming the via hole in the insulating layer by selective anisotropic etching relative to the doped region of the silicon layer.

6 Claims, 2 Drawing Sheets

METHOD FOR PRODUCING A VIA HOLE TO A DOPED REGION

BACKGROUND OF THE INVENTION

The present method relates generally to methods for forming vias, i.e., contacts, in semiconductor devices. More specifically, the invention relates to methods for forming vias in high density integrated circuits.

In the manufacture of integrated circuits, at least one wiring level that connects individual components of the circuit, usually MOS transistors, to one another is formed after the fabrication of the individual components.

In conventional technologies, a relatively thick insulating layer, usually composed of silicon oxide with additives, is deposited for that purpose. Via holes are anisotropically etched through this insulating layer, i.e., with vertical privileged direction, with the assistance of a photoresist mask, down to the contacting regions of the components. Included among these contacting regions are gates and doped regions of the transistors.

To make the contacts, a metallization is deposited, for example an AlSiCu alloy. The metallization fills up the via holes and forms a continuous layer at the surface of the insulating layer. This continuous layer then is structured to provide the finished wiring level.

In this process, the via holes must be placed such that a clearance distance is assured between the location of the via hole and neighboring, conductive regions in or at the surface of the substrate. Particularly when contacting doped regions of a MOS transistor, a clearance distance to neighboring gate electrodes must be assured in order to avoid shorts. This clearance distance must be of such a size that it is sure to intercept the unavoidable process and alignment tolerances. Yet, this clearance distance causes a loss in space that is especially detrimental in miniaturized, integrated circuits having extremely high packing densities, for example, dynamic random access memories, DRAMs.

Methods that address this disadvantage are known from literature in the relevant art.

K H. Kuesters, et al., Sympos. on VLSI Technology, 1987 Tech. Digest, pages 93 ff, incorporated herein by reference, discloses that the gate electrodes can be enveloped with an insulating cover layer and insulating side wall coverings, what are referred to as spacers, before the deposition of the thick, insulating layer. Subsequently, a thin auxiliary layer of, for example, silicon nitride is deposited. After this, the thick insulating layer in which the via holes are opened is deposited. The auxiliary layer thereby acts as an etch stop. The auxiliary layer in the opened via holes is subsequently selectively etched off relative to the substrate and relative to the insulation enveloping the gate electrodes. In this method, the via holes can be placed overlapping relative to the gate electrodes. A high etching selectivity of silicon nitride relative to the insulation enveloping the gate electrodes, usually silicon oxide, is required in this method.

Another method is disclosed in K. H. Kuesters, et al., ESSDERC 1988, Journal de Physique, pages 503 ff, incorporated herein by reference, which can be utilized given inadequate etching selectivity of silicon nitride to oxide. In this method, a thin layer of polysilicon is additionally deposited over the auxiliary layer of silicon nitride. After the via holes are etched through the thick insulating layer—the thin polysilicon layer acting as etch stop therein—the polysilicon is first selectively etched relative to silicon nitride and the silicon nitride is then selectively etched relative to the substrate. Outside the contact regions, the polysilicon layer remaining under the insulating layer is later oxidized by suitable tempering in an $O_2$ atmosphere. But, this process step is extremely problematical.

Auxiliary layers that must in turn be completely removed in the via hole region are utilized in both of these known methods.

It is fundamentally impossible in the two known methods to simultaneously open via holes to doped regions in the substrate, source/drain regions, and to gate electrodes of polysilicon. The via holes to the gate electrodes must be opened after the silicon nitride etching.

SUMMARY OF THE INVENTION

The invention provides a method for producing a via hole to a doped region, which avoids the removal of auxiliary layers in the contact region and which is particularly suited for simultaneously opening via holes to source/drain regions and gate electrodes.

In an embodiment, the invention provides a method for producing a via hole to a doped region in a semiconductor device, comprising the steps of:

producing the doped region in a substrate such that the doped region is limited by insulating regions at least at a surface of the substrate;

depositing an undoped silicon layer surface-wide on the substrate;

producing a doped region in the silicon layer that overlaps a region in which a via hole to the doped region in the substrate is to be formed;

selectively removing all undoped silicon of the silicon layer relative to the doped region of the silicon layer;

producing an insulating layer surface-wide; and opening a via hole in the insulating layer by selective anisotropic etching relative to the doped region of the silicon layer.

In an embodiment of the invention, the substrate is composed of single-crystal silicon.

In an embodiment of the invention, the silicon layer comprises amorphous silicon.

In an embodiment of the invention, the undoped silicon of the silicon layer is removed by wet-chemical etching.

In an embodiment of the invention, the doped region of the silicon layer is produced by implantation with a mask.

In an embodiment of the invention, the doped region of the silicon layer is p-doped and the undoped silicon of the silicon layer are removed by wet-chemical etching with potassium hydroxide solution.

In an embodiment of the invention, the doped region of the silicon layer is formed with a boron concentration between $10^{18}$ cm$^{-3}$ and $10^{20}$ cm$^{-3}$.

In an embodiment of the invention, the doped region in the substrate is a source-drain region of an MOS transistor; and wherein the insulating regions comprise insulating side wall coverings and insulating cover layers of the gate electrode of the MOS transistor.

In an embodiment of the invention, the doped region in the substrate is p-doped; the doped region of the silicon layer is p-doped; the gate electrode is formed of polysilicon; and the insulating side wall covering and the insulating cover layers are formed of silicon oxide.

In an embodiment of the invention, the insulating layer in which the via hole is opened contains $SiO_2$; and comprising the further step of simultaneously forming a further via hole to the gate electrode when the via hole to the doped region is formed.

The method of the invention makes use of the fact that undoped silicon can be selectively removed relative to doped silicon. The undoped silicon layer, which can be amorphous, is selectively doped in a region where the via hole is to be formed, for example by ion implantation with a mask. Subsequently, the undoped part of the silicon layer is selectively removed relative to the doped region. An insulation layer, in which the via hole is selectively opened relative to the doped region of the silicon layer by anisotroping etching, is produce surface-wide. The doped region of the silicon layer thereby acts as an etch stop. Thus, the silicon layer introduced as an auxiliary layer need no longer be removed in the region of the via hole.

It is especially advantageous to generate the silicon layer such that it is composed of polysilicon at least in the doped region, since silicon oxide, which is what the insulation layer usually essentially contains, can be etched with high selectivity relative to polysilicon.

The problematical, subsequent oxidization of the silicon layer required in the prior art is eliminated since the undoped parts of the silicon layer outside the via hole are removed.

A highly conductive, extension contact area at the surface of the doped region that is to be contacted can be had by setting a high doping in the doped region of the silicon layer. Low connecting resistances for the contacts formed by a metallization filling up the via hole can be achieved as a result thereof.

It can be appreciated that the method enables a simultaneous formation of via holes to gate electrodes of polysilicon and the via hole to the doped region in the substrate. When the insulating cover layer of the gate electrodes and the insulating layer are essentially composed of silicon oxide, then the polysilicon of the gate electrode acts as an etch stop in the via hole etching in the region of the gate electrode and the doped region of the silicon layer acts as an etch stop in the region of the doped region.

The invention is set forth in greater detail in the following detailed description of the presently preferred embodiments and accompanying drawings.

DETAILED DESCRIPTION OF THE PRESENTLY PREFERRED EMBODIMENTS

Figure 1:
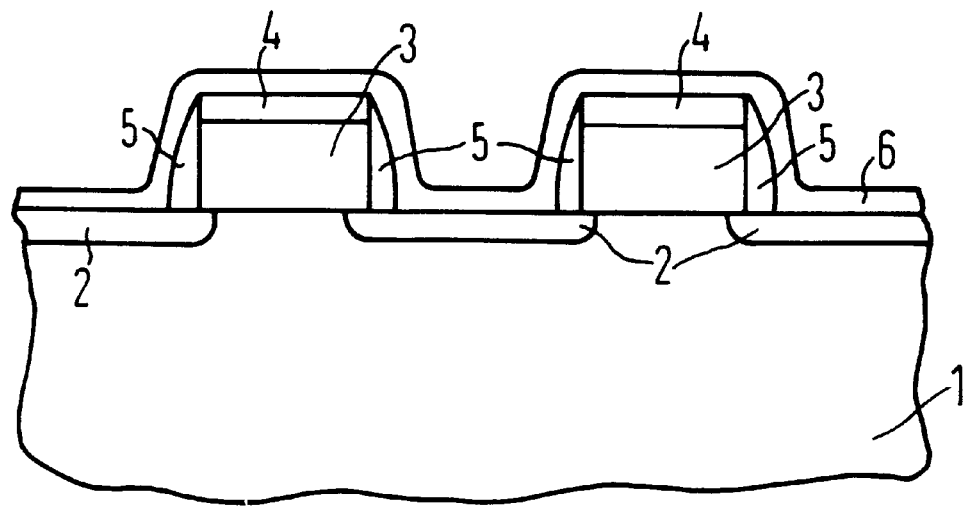
FIG. 1 illustrates a substrate in which MOS transistors are to be produced and at whose surface a silicon layer is generated.
Figure 2:
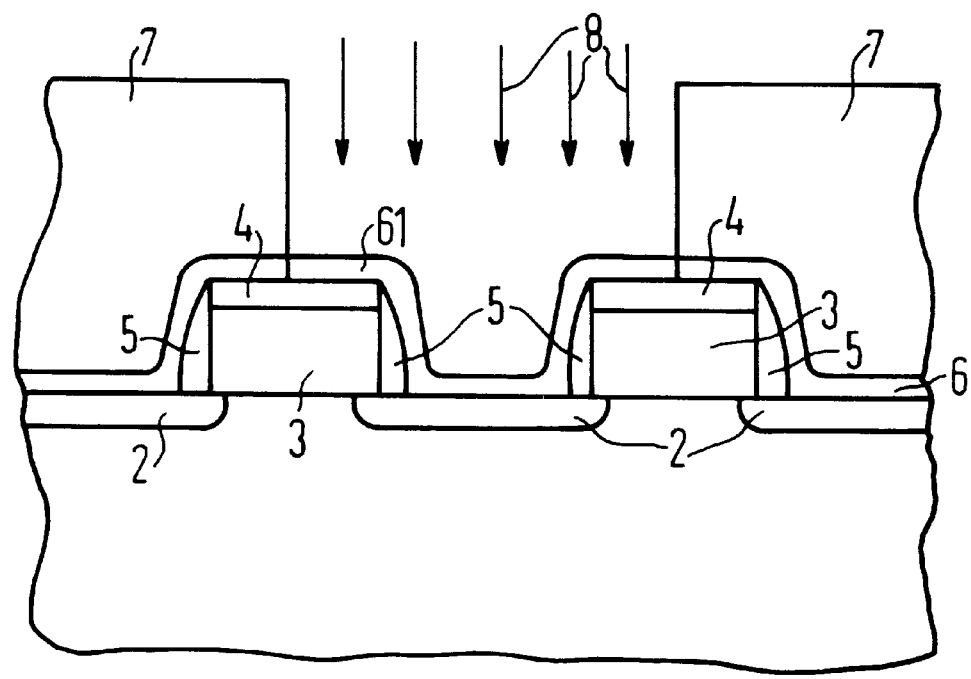
FIG. 2 illustrates the selective doping of the silicon layer of the substrate of FIG. 1.

As described above, the present invention provides a method for producing a via hole to a doped region that does not require special formation and removal of special insulating layers. Instead, a silicon layer is doped in the region of the via hole to be produced so that the silicon layer can be easily and selectively removed thereabout, thus leaving the doped region through which the via hole can be formed.

An embodiment of the invention is illustrated in FIGS. 1–4. Therein, commencing with reference to FIG. 1, doped regions 2 are arranged in a substrate 1 of, for example, single-crystal silicon. The doped regions 2, for example, are source or drain regions of MOS transistors. For example, they are p-doped.

Gate electrodes 3 of doped polysilicon are arranged at the surface of the substrate 1 between two doped regions 2 that act as source and drain region. The gate electrodes 3 are provided with an insulating cover layer 4 of, for example, $SiO_2$. Spacers 5 that are likewise composed, for example, of $SiO_2$ are arranged at the side walls of the gate electrodes 3 and of the insulating cover layer 4.

In accordance with the illustrated method, a silicon layer 6 is produce surface-wide, this silicon layer 6 covering the exposed surfaces of the doped regions 2 and the surfaces of the insulating cover layers 4 and of the spacers 5. The silicon layer 6 is deposited amorphously or polycrystalline. At this point, the silicon layer 6 is undoped (see FIG. 1).

Thereafter, a photoresist mask 7 is produced that leaves exposed a region of the silicon layer 6 that is sure to overlap the expanse of a via hole to be produced. Upon employment of the photoresist mask 7 as an implantation mask, a doped region 61 of the silicon layer is produced by implantation with, for example, boron, as indicated by arrows 8. For example, the implantation ensues with an ion energy of 10 keV and a particle density of $10^{15}$ cm$^{-2}$ (see FIG. 2). Then the photoresist mask is removed by any suitable known method.

Figure 3:
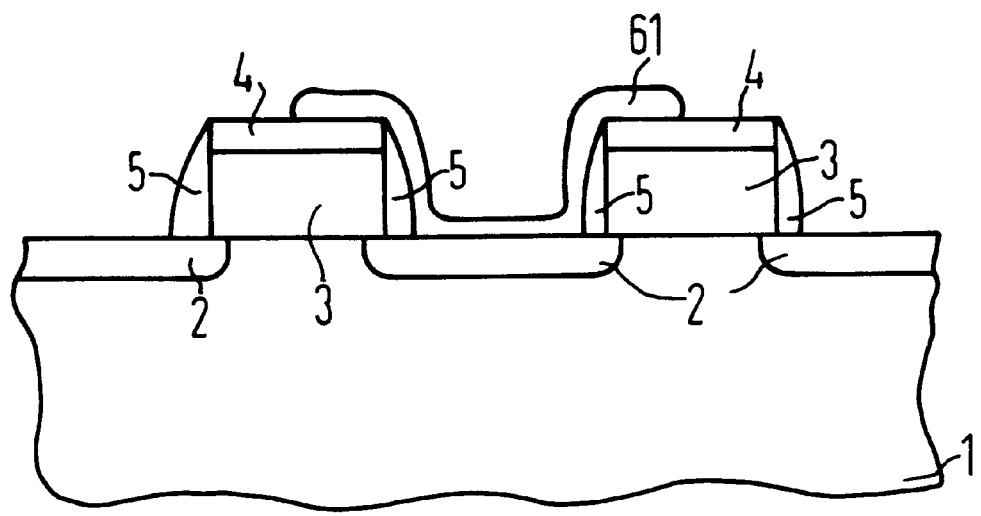
FIG. 3 illustrates how the doped region of the silicon layer of the substrate overlaps the via hole region.
Figure 4:
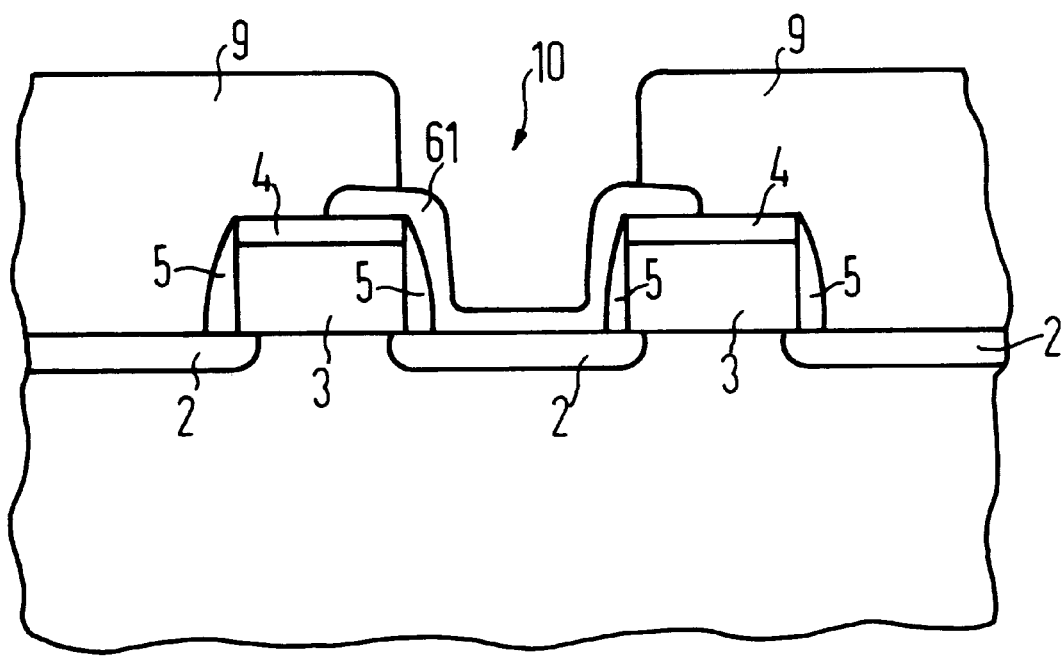
FIG. 4 illustrates a via hole formed in a insulating layer formed over the substrate of FIG. 3.

After removal of the photoresist mask 7, the undoped part of the silicon layer 6 is selectively removed relative to the doped region 61, preferably by selective, wet-chemical etching with potassium hydroxide solution (see FIG. 3). Then an insulating layer 9 is formed surface-wide.

After the surface-wide application of an insulating layer 9 that, for example, is essentially composed of $SiO_2$, a via hole 10 is opened by active ion etching with, for example, $CF_6$ upon employment of a further photoresist mask (not shown) as an etching mask. During the via hole etching, the doped region 61 of the silicon layer acts as an etch stop (see FIG. 4).

It can be appreciated that when via holes to the gate electrodes are to be opened or formed in the same process, care must be exercised to ensure that the doped region 61 of the silicon layer 6 is not formed so as to overlap the region for the via hole to the gate electrode. Instead, the via holes to the gate electrodes are opened through the insulating layer 9 and through the insulating cover layer 4.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for producing a via hole to a doped region in a semiconductor device, comprising the steps of:

providing a substrate;

generating in the substrate a doped region that is laterally limited by insulating regions, which insulating regions are positioned at least on a surface of the substrate;

depositing an undoped, amorphous silicon layer surface-wide on the substrate;

producing a doped region in the amorphous silicon layer that overlies the doped region in the substrate by masked implantation of boron;

selectively removing undoped amorphous silicon in the amorphous silicon layer relative to the doped region in the amorphous silicon layer by wet chemical etching with potassium hydroxide solution;

producing an insulating layer surface-wide on the substrate; and forming the via hole in the insulating layer by selectively anisotropically etching the insulating layer to remove a portion thereof that overlies the doped region in the amorphous silicon layer, while employing the doped region in the amorphous silicon layer as an etching stop in the formation of the via hole, wherein the doped region of the amorphous silicon layer is formed to have a boron concentration between $10^{18}$ cm$^{-3}$ and $10^{20}$ cm$^{-3}$.

2. The method of claim 1, wherein the substrate is composed of single-crystal silicon.

3. The method of claim 1, wherein the doped region of the amorphous silicon layer is p-doped.

4. The method of claim 1, wherein the doped region in the substrate is a source/drain region of an MOS transistor; and wherein the insulating regions in the substrate comprise insulating side wall coverings and insulating cover layers of a gate electrode of the MOS transistor.

5. The method of claim 4, wherein:

the doped region in the substrate is p-doped;

the doped region of the amorphous silicon layer is p-doped;

the gate electrode is formed of polysilicon; and the insulating side wall covering and the insulating cover layers are formed of silicon oxide.

6. The method of claim 5, wherein:

the insulating layer in which the via hole is formed comprises $SiO_2$; and comprising the further step of simultaneously forming a further via hole to the gate electrode when the via hole to the doped region in the amorphous silicon layer is formed.

* * * * *